United States Patent
Cheng et al.

(10) Patent No.: US 10,923,590 B2
(45) Date of Patent: Feb. 16, 2021

(54) WRAP-AROUND CONTACT FOR VERTICAL FIELD EFFECT TRANSISTORS

(71) Applicant: International Business Machines Corporation, Armonk, NY (US)

(72) Inventors: Kangguo Cheng, Schenectady, NY (US); Chanro Park, Clifton Park, NY (US); Julien Frougier, Albany, NY (US); Ruilong Xie, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/361,563

(22) Filed: Mar. 22, 2019

(65) Prior Publication Data

US 2020/0303543 A1 Sep. 24, 2020

(51) Int. Cl.
*H01L 29/78* (2006.01)
*H01L 29/66* (2006.01)
*H01L 21/768* (2006.01)
*H01L 21/8234* (2006.01)
*H01L 27/088* (2006.01)

(52) U.S. Cl.
CPC .... *H01L 29/7827* (2013.01); *H01L 21/76834* (2013.01); *H01L 21/823468* (2013.01); *H01L 21/823475* (2013.01); *H01L 21/823487* (2013.01); *H01L 27/088* (2013.01); *H01L 29/6653* (2013.01); *H01L 29/66666* (2013.01)

(58) Field of Classification Search
CPC ....... H01L 21/76834; H01L 21/823468; H01L 21/823475; H01L 21/823487; H01L 27/088; H01L 29/6653; H01L 29/66666; H01L 29/7827
See application file for complete search history.

(56) References Cited

U.S. PATENT DOCUMENTS

| | | | |
|---|---|---|---|
| 9,318,581 B1 | 4/2016 | Guo et al. | |
| 9,425,310 B2 | 8/2016 | Yang | |
| 9,443,769 B2 | 9/2016 | Chen et al. | |
| 9,735,253 B1* | 8/2017 | Bi ........................ | H01L 29/7827 |
| 9,773,708 B1* | 9/2017 | Zhang ................ | H01L 21/82382 |
| 9,773,913 B1 | 9/2017 | Balakrishnan et al. | |
| 9,805,935 B2 | 10/2017 | Anderson et al. | |
| 10,483,361 B1* | 11/2019 | Lee ..................... | H01L 21/82343 |
| 2011/0147840 A1 | 6/2011 | Cea et al. | |
| 2015/0255604 A1 | 9/2015 | Yang | |
| 2016/0247711 A1* | 8/2016 | Kim ..................... | H01L 27/2436 |
| 2017/0148913 A1* | 5/2017 | Masuoka .......... | H01L 29/66666 |

(Continued)

*Primary Examiner* — Allan R Wilson
(74) *Attorney, Agent, or Firm* — Cantor Colburn LLP; Joseph Petrokaitis

(57) ABSTRACT

Embodiments of the present invention are directed to forming a wrap-around contact (WAC) for a vertical field effect transistor (VFET). In a non-limiting embodiment of the invention, a top spacer is formed on a surface of a gate. A sacrificial spacer is formed on the top spacer. A source/drain region is formed over the top spacer and between sidewalls of the sacrificial spacer. The sacrificial spacer can be replaced with a wrap-around contact. The source/drain region can include a first material, the sacrificial spacer can include a second material, and the second material can be selected such that the second material can be etched selective to the first material.

19 Claims, 14 Drawing Sheets

(56) References Cited

U.S. PATENT DOCUMENTS

| | | |
|---|---|---|
| 2017/0373159 A1 | 12/2017 | Miao et al. |
| 2018/0090582 A1 | 3/2018 | Adusumilli et al. |
| 2019/0181042 A1* | 6/2019 | Xie .................... H01L 21/321 |
| 2020/0075736 A1* | 3/2020 | Lee .................... H01L 29/6656 |
| 2020/0075737 A1* | 3/2020 | Lee .................... H01L 29/45 |
| 2020/0105928 A1* | 4/2020 | Lee .................... H01L 27/088 |
| 2020/0119002 A1* | 4/2020 | Xie ................ H01L 21/823431 |

* cited by examiner

WRAP-AROUND CONTACT FOR VERTICAL FIELD EFFECT TRANSISTORS

BACKGROUND

The present invention generally relates to fabrication methods and resulting structures for semiconductor devices, and more specifically, to forming a wrap-around contact (WAC) for a vertical field effect transistor (VFET).

Traditional metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, VFETs employ semiconductor fins and side-gates can be contacted outside the active region, resulting in increased device density and some increased performance over lateral devices. In contrast to planar FETs, the source to drain current in a VFET flows through the vertical fin in a direction that is perpendicular with respect to a horizontal major surface of the wafer or substrate. A VFET can achieve a smaller device footprint because its channel length is decoupled from the contacted gate pitch.

SUMMARY

Embodiments of the invention are directed to a method for forming a WAC for a VFET. A non-limiting example of the method includes forming a top spacer on a recessed surface of a gate. A sacrificial spacer can be formed on the top spacer. A source/drain region can be formed over the top spacer and between sidewalls of the sacrificial spacer. The method can include replacing the sacrificial spacer with a wrap-around contact. The source/drain region can include a first material, the sacrificial spacer can include a second material, and the second material can be selected such that the second material can be etched selective to the first material.

Embodiments of the invention are directed to a method for forming a WAC for a VFET. A non-limiting example of the method includes forming a top spacer on a recessed surface of a gate. A sacrificial spacer can be formed on the top spacer. A source/drain region can be formed over the top spacer and between sidewalls of the sacrificial spacer. The method can include recessing a surface of the sacrificial spacer and forming a wrap-around contact on the recessed surface of the sacrificial spacer. The source/drain region can include a first material, the sacrificial spacer can include a second material, and the second material can be selected such that the second material can be etched selective to the first material.

Embodiments of the invention are directed to a semiconductor structure. A non-limiting example of the semiconductor device includes a semiconductor fin on a bottom source/drain region of a substrate. The semiconductor device can include a gate over a channel region of the semiconductor fin and a top source/drain region on a surface of the semiconductor fin. The semiconductor device can include a top spacer between a surface of the top source/drain region and the gate. A wrap-around contact can be positioned on sidewalls and a top surface of the top source/drain region.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
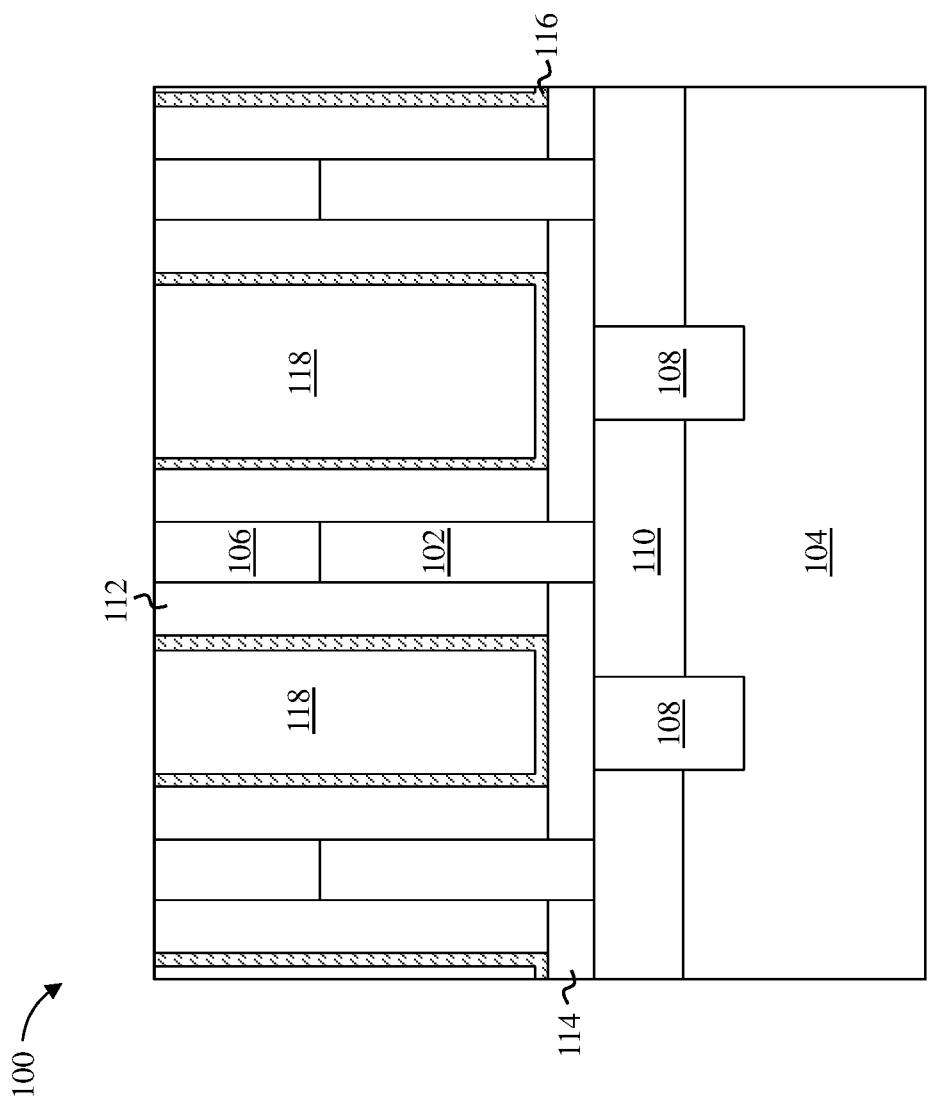
FIG. 1 depicts a cross-sectional view of a semiconductor structure after a processing operation according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as next generation non-planar transistor technologies such as the VFET continue to scale, source/drain widths continue to shrink. Moreover, source/drain heights are becoming relatively taller (while the actual heights can decrease, the ratio of the height to width is increasing). Consequently, the landing surface area (contact area) of conventional top source/drain contacts in VFETs is shrinking. This can result in contact misalignments, dead or partially dead devices, and lower device yields in the conventional VFET process flow.

Turning now to an overview of aspects of the present invention, one or more embodiments of the invention address the above-described shortcomings of the prior art by providing a new VFET semiconductor structure and a method for forming a wrap-around contact (WAC) on a top source/drain of a VFET. The method can include recessing a gate to expose sidewalls of a VFET fin. A top spacer can be formed on the recessed surface of the gate and sacrificial spacers can be formed over the top spacer. In some embodiments of the invention, a top source/drain is formed on the VFET fin, between the sacrificial spacers. The sacrificial spacers can then be removed to form a cavity around sidewalls of the top source/drain. This cavity can be filled with conductive material to form a WAC on the top source/drain.

Turning now to a more detailed description of aspects of the present invention, FIG. 1 depicts a cross-sectional view of a semiconductor structure 100 during an intermediate operation of a method of fabricating a final semiconductor device according to one or more embodiments of the invention. In the embodiment shown in FIG. 1, the semiconductor structure 100 includes one or more semiconductor fins 102 formed over a substrate 104.

The one or more semiconductor fins 102 can be formed on the substrate 104 using known semiconductor fabrication techniques, including but not limited to, lithography followed by etching, sidewall image transfer (SIT), self-aligned double patterning (SADP), self-aligned multiple patterning (SAMP), and self-aligned quadruple patterning (SAQP). In some embodiments of the invention, a hard mask 106 is patterned to expose portions of the substrate 104. The exposed portions of the substrate 104 can then be recessed to form a plurality of semiconductor fins. The exposed portions of the substrate 104 can be removed using an etch process, which can be a wet etch process, a dry etch process or a combination thereof. In some embodiments of the invention, the hard mask 106 includes a nitride, such as silicon nitride. In some embodiments of the invention, the hard mask 106 is formed to a thickness of 40 nm, although other thicknesses are within the contemplated scope of the invention.

The semiconductor fins 102 can each have a height ranging from 15 nm to 150 nm. In some embodiments of the present invention, the semiconductor fins 102 are formed to a height of about 20 nm. Each of the semiconductor fins 102 can have a width ranging from 5 nm to 50 nm. The semiconductor fins 102 can be separated by a pitch ranging from 10 nm to 100 nm. The semiconductor fins 102 can be doped with n-type dopants (e.g., As, P, Sb) or p-type dopants (e.g., B, Al, Ga), or can be intrinsically undoped (i.e., doping concentration less than $1 \times 10^{16}$ cm$^{-3}$) to form nFET semiconductor fins and pFET semiconductor fins, as desired. If the semiconductor fins 102 are doped, the dopant concentration can range from $1 \times 10^{16}$ cm$^{-3}$ to $2 \times 10^{21}$ cm$^{-3}$, or between $1 \times 10^{18}$ cm$^{-3}$ and $1 \times 10^{20}$ cm$^{-3}$. In some embodiments of the invention, the semiconductor fins 102 are epitaxially grown on the substrate 104.

The semiconductor fins 102 can be made of any suitable material, such as, for example, silicon, silicon germanium, Group II-IV compound semiconductor, Group III-V compound semiconductor, or other suitable materials. Group III-V compound semiconductors include materials having at least one group III element and at least one group V element, such as, for example, one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

The substrate 104 can be made of any suitable substrate material, such as, for example, silicon, silicon germanium, silicon carbide (SiC), Group III-V compound semiconductor, Group II-VI compound semiconductor, or semiconductor-on-insulator (SOI). For example, in embodiments where the semiconductor fins 102 are made of InGaAs, the substrate 104 can be made of InP. In some embodiments of the invention, the substrate 104 includes a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention. In some embodiments of the invention, the semiconductor structure 100 can be electrically isolated from other regions of the substrate 104 by a shallow trench isolation region 108. The shallow trench isolation region 108 can be made of any suitable dielectric material, such as, for example, a low-k dielectric, a nitride, silicon nitride, silicon oxide, SiON, SiC, SiOCN, or SiBCN. In some embodiments of the invention, the shallow trench isolation region 108 includes silicon nitride or SiBCN.

As further depicted in FIG. 1, the semiconductor structure 100 can include a bottom source/drain 110. In some embodiments of the invention, the bottom source/drain 110 is formed by doping a top portion of the substrate 104. In some embodiments of the invention, the bottom source/drain 110 is epitaxially grown on the substrate 104. Epitaxial semiconductor materials can be grown using, for example, vapor-phase epitaxy (VPE), molecular beam epitaxy (MBE), liquid-phase epitaxy (LPE), or other suitable processes. The bottom source/drain 110 can include epitaxial semiconductor materials grown from gaseous or liquid precursors.

In some embodiments of the invention, the gas source for the deposition of epitaxial semiconductor material includes a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxial silicon and silicon germanium can be doped by adding n-type dopants (e.g., phosphorus or arsenic) or p-type dopants (e.g., Ga, B, $BF_2$, or Al). In some embodiments of the invention, the bottom source/drain 110 can be epitaxially formed and doped by a variety of methods, such as, for example, in-situ doped epitaxy (doped during deposition), and/or doped following the epitaxy, for example, by ion implantation, gas phase doping, plasma doping, plasma immersion ion implantation, cluster doping, infusion doping, liquid phase doping, solid phase doping, and/or any suitable combination of those techniques. In some embodiments, dopants are activated by thermal annealing such as laser annealing, flash annealing, rapid thermal annealing (RTA) or any suitable combination of those techniques. The dopant concentration in the doped regions can range from $1 \times 10^{19}$ cm$^{-3}$ to $2 \times 10^{21}$ cm$^{-3}$, or between $1 \times 10^{20}$ cm$^{-3}$ and $1 \times 10^{21}$ cm$^{-3}$.

As further depicted in FIG. 1, the semiconductor device 100 can include one or more gates 112. In some embodiments of the invention, the gates 112 can be high-k metal gates (HKMGs) formed using, for example, known replacement metal gate (RMG) processes, or so-called gate-first processes. The gates 112 can include high-k dielectric material(s) (e.g., a gate dielectric) and a work function metal stack (not shown). In some embodiments of the invention, the gates 112 further includes a main body formed from bulk conductive gate material(s).

In some embodiments of the invention, the gate dielectrics include a high-k dielectric film formed on a surface (sidewall) of the semiconductor fins 102. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

In some embodiments of the invention, the gates 112 include one or more work function layers (sometimes referred to as a work function metal stack) formed between the high-k dielectric film and a bulk gate material. In some embodiments of the invention, the gates 112 include one or more work function layers, but do not include a bulk gate material.

The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to modify the work function of the gates 112 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness. In some embodiments of the invention, the work function layers include a TiN/TiC/TiCAl stack.

In some embodiments of the invention, a bulk gate conductive material is deposited over the work function layers. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive material can further include dopants that are incorporated during or after deposition.

As further depicted in FIG. 1, a bottom spacer 114 can be formed over the shallow trench isolation region 108 and the bottom source/drain 110. In some embodiments of the invention, the bottom spacer 114 is formed using a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, or other like process. For example, spacer material can be directionally, conformally, or bulk deposited over the semiconductor structure 100 or between the gates 112 and the bottom source/drain 110.

In some embodiments of the invention, the bottom spacer 114 is conformally formed using CVD or ALD. The bottom spacer 114 can be made of any suitable material, such as, for example, a low-k dielectric, a nitride, silicon nitride, silicon oxide, SiON, SiC, SiOCN, or SiBCN. A low-k dielectric can include a dielectric material having a dielectric constant less than the dielectric constant of silicon dioxide (e.g., less than about 3.9). The bottom spacer 114 can be formed to a thickness of about 5 to 10 nm, although other thicknesses are within the contemplated scope of the invention.

As illustrated in FIG. 1, a liner 116 (sometimes referred to as the first interlayer dielectric) can be formed over the semiconductor structure 100. The liner 116 can be formed or deposited using any suitable method, such as, for example, CVD, PECVD, UHVCVD, RTCVD, MOCVD, LPCVD, LRPCVD, ALD, PVD, chemical solution deposition, or other like process. In some embodiments of the invention, the liner 116 is conformally deposited over sidewalls of the gates 112 and a surface of the bottom spacer 114 using, for example, ALD, although other conformal deposition processes are within the contemplated scope of the invention. The liner 116 can be made of any suitable material, such as, for example, a low-k dielectric, a nitride, silicon nitride, SiON, SiC, SiOCN, or SiBCN. In some embodiments of the invention, the liner 116 includes a carbon doped silicon (SiC). The liner 116 can be formed to a nominal (conformal) thickness of about 5 nm or less, or 3 nm or less, although other thicknesses are within the contemplated scope of the invention.

As illustrated in FIG. 1, an interlayer dielectric 118 (sometimes referred to as the second interlayer dielectric) can be formed over the semiconductor structure 100 between adjacent gates of the gates 112. The interlayer dielectric 118 serves as an isolation structure for the semiconductor fins 102. The interlayer dielectric 118 can be made of any suitable dielectric material, such as, for example, porous silicates, carbon doped oxides, silicon dioxides, silicon nitrides, silicon oxynitrides, silicon carbide (SiC), or other dielectric materials. Any known manner of forming the interlayer dielectric 118 can be utilized, such as, for example, CVD, PECVD, ALD, flowable CVD, spin-on dielectrics, or PVD.

In some embodiments of the invention, a surface of the semiconductor structure 100 is planarized, using, for example a chemical-mechanical planarization (CMP) process. In some embodiments of the invention, the semiconductor structure 100 is planarized to expose a surface of the hard mask 106. In some embodiments of the invention, the semiconductor structure 100 is planarized selective to a surface of the hard mask 106 and/or the gate 112.

Figure 2:
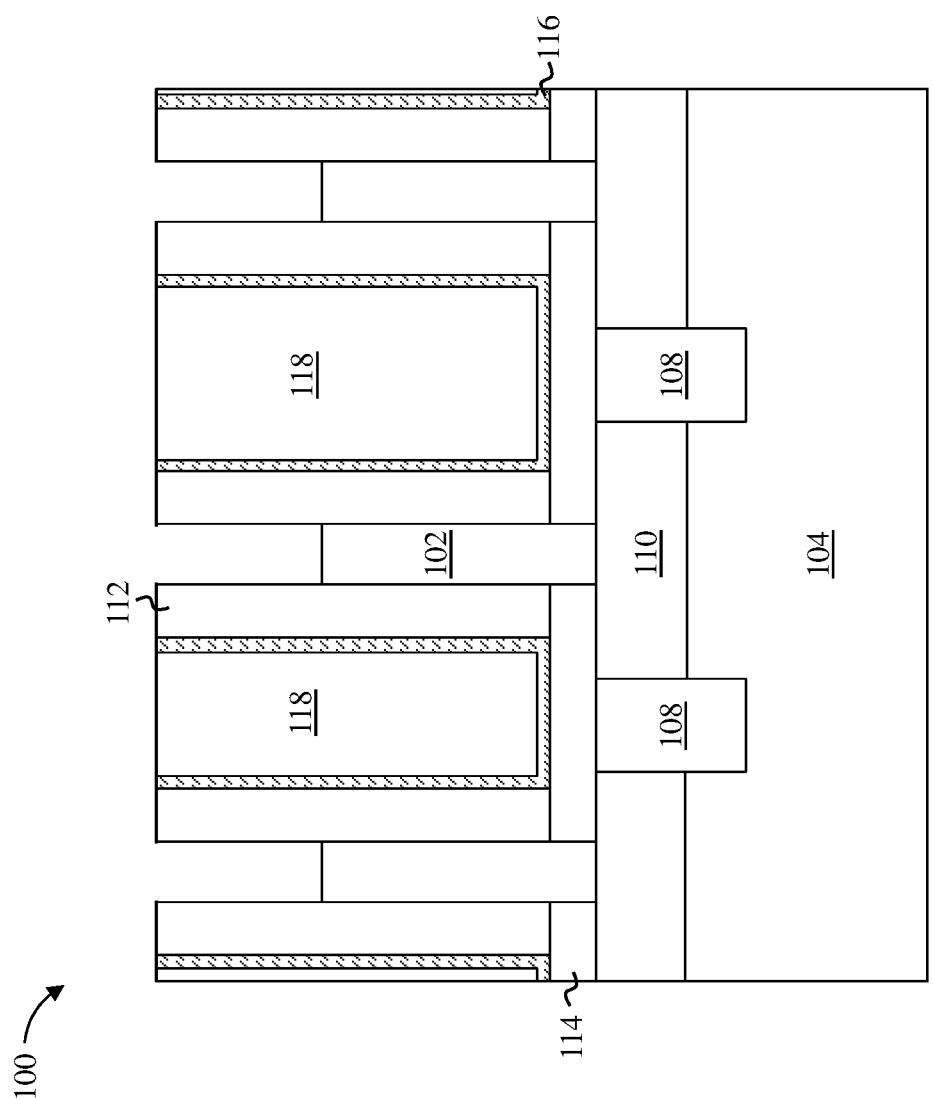
FIG. 2 depicts a cross-sectional view of a semiconductor structure after a processing operation according to one or more embodiments of the invention.

FIG. 2 depicts a cross-sectional view of the semiconductor structure 100 after a processing operation according to one or more embodiments of the invention. As illustrated in FIG. 2, the hard mask 106 can be removed to expose a surface of the semiconductor fins 102. The hard mask 106 can be removed using any suitable method, such as a wet etch, a dry etch, or a combination of sequential wet and/or dry etches. In some embodiments of the invention, the hard mask 106 is etched selective to the gates 112 and/or the semiconductor fins 102.

Figure 3:
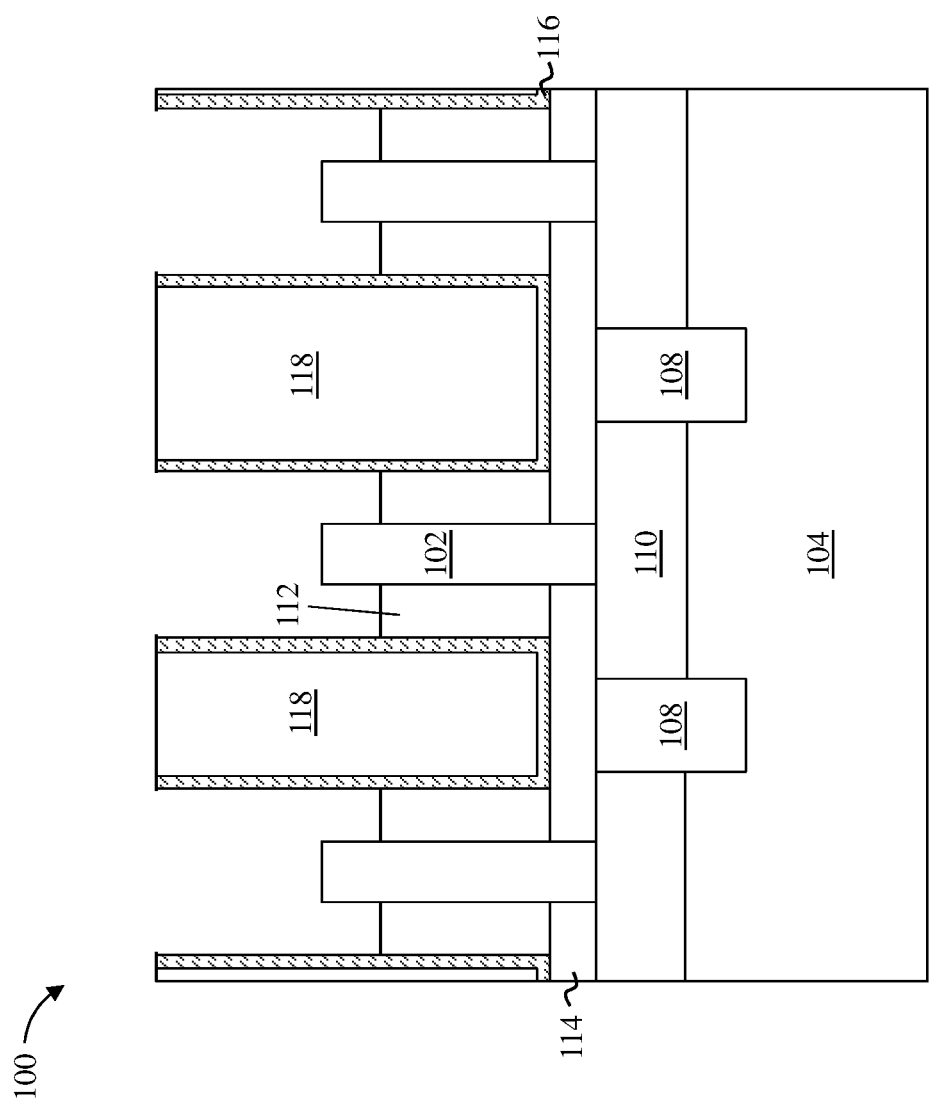
FIG. 3 depicts a cross-sectional view of a semiconductor structure after a processing operation according to one or more embodiments of the invention.

FIG. 3 depicts a cross-sectional view of the semiconductor structure 100 after a processing operation according to one or more embodiments of the invention. As illustrated in FIG. 3, the gates 112 can be recessed below a surface of the semiconductor fins 102. The gates 112 can be recessed using any suitable method, such as a wet etch, a dry etch, or a combination of sequential wet and/or dry etches. In some embodiments of the invention, the gates 112 are recessed selective to the liner 116 and/or the semiconductor fins 102. In some embodiments of the invention, the gates 112 are recessed using an isotropic etch.

Figure 4:
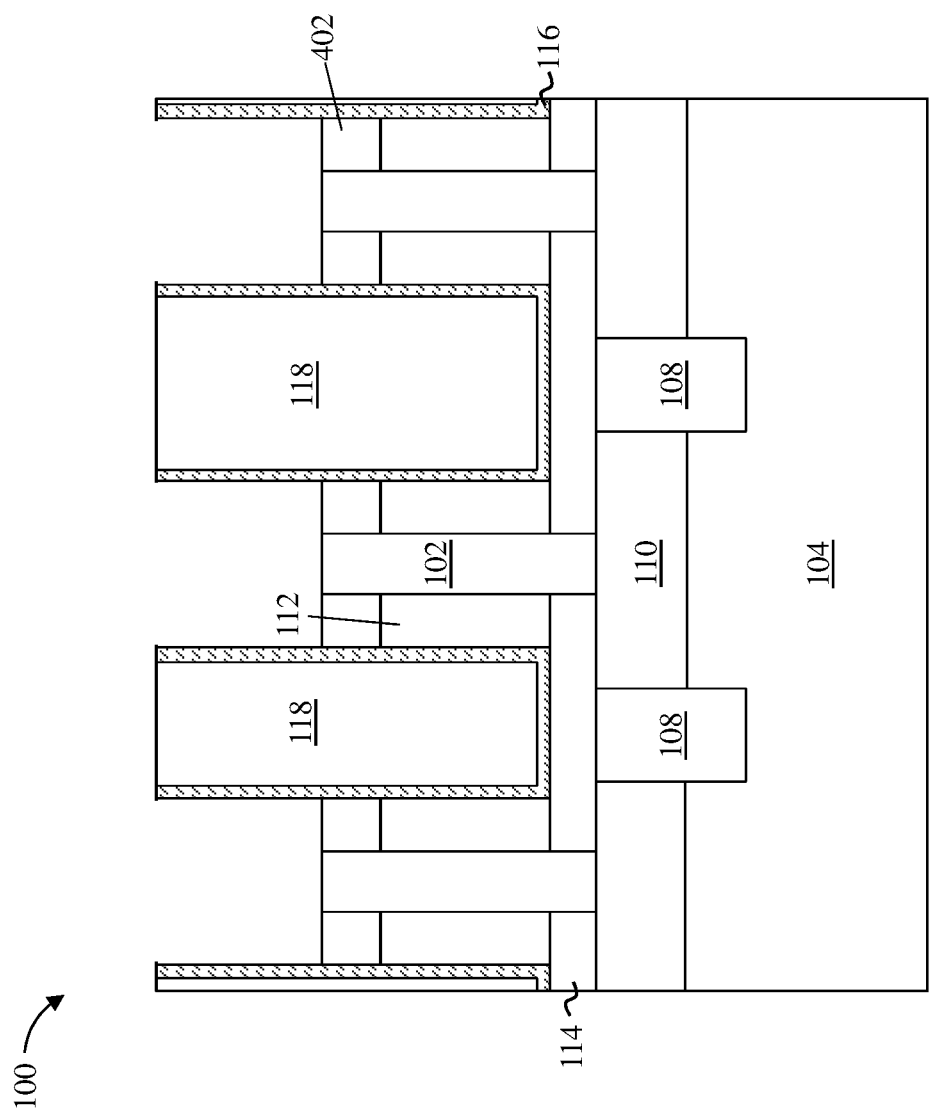
FIG. 4 depicts a cross-sectional view of a semiconductor structure after a processing operation according to one or more embodiments of the invention.

FIG. 4 depicts a cross-sectional view of the semiconductor structure 100 after a processing operation according to one or more embodiments of the invention. As illustrated in FIG. 4, a top spacer 402 can be formed over the recessed surfaces of the gates 112. In some embodiments of the invention, the top spacer 402 is formed using CVD or ALD followed by an isotropic etch back. For example, a bulk dielectric material of the top spacer 402 can be deposited over the gates 112 and an isotropic etch back can planarize the top spacer 402 to a surface of the semiconductor fins 102.

The top spacer 402 can be made of any suitable material, such as, for example, a low-k dielectric, a nitride, silicon nitride, silicon oxide, SiON, SiC, SiOCN, or SiBCN. A low-k dielectric can include a dielectric material having a dielectric constant less than the dielectric constant of silicon dioxide (e.g., less than about 3.9). The top spacer 402 can be formed to a thickness of about 5 to 10 nm, although other thicknesses are within the contemplated scope of the invention.

Figure 5:
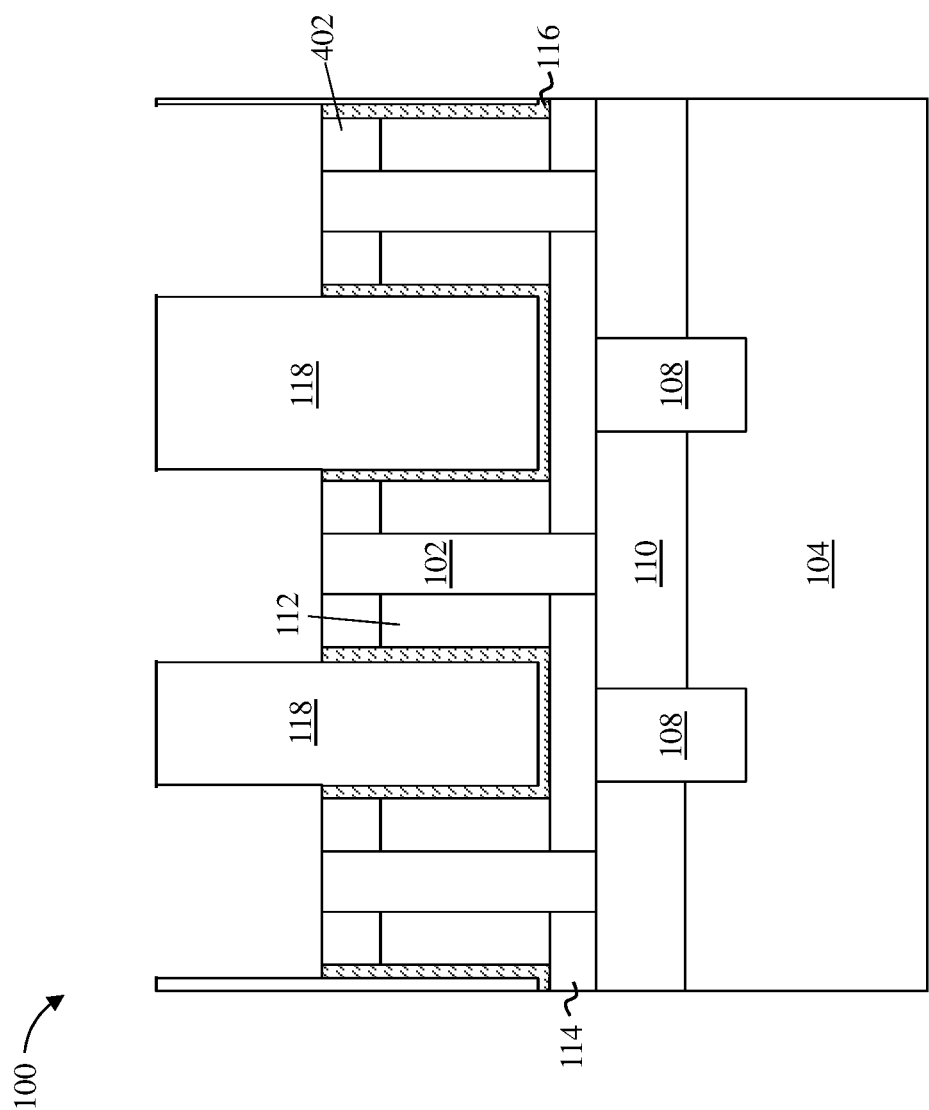
FIG. 5 depicts a cross-sectional view of a semiconductor structure after a processing operation according to one or more embodiments of the invention.

FIG. 5 depicts a cross-sectional view of the semiconductor structure 100 after a processing operation according to one or more embodiments of the invention. As illustrated in FIG. 5, exposed sidewalls of the liner 116 can be removed. Removing portions of the liner 116 exposes a portion of the interlayer dielectric 118. Portions of the liner 116 can be removed using any suitable method, such as a wet etch, a dry etch, or a combination of sequential wet and/or dry etches.

Figure 6:
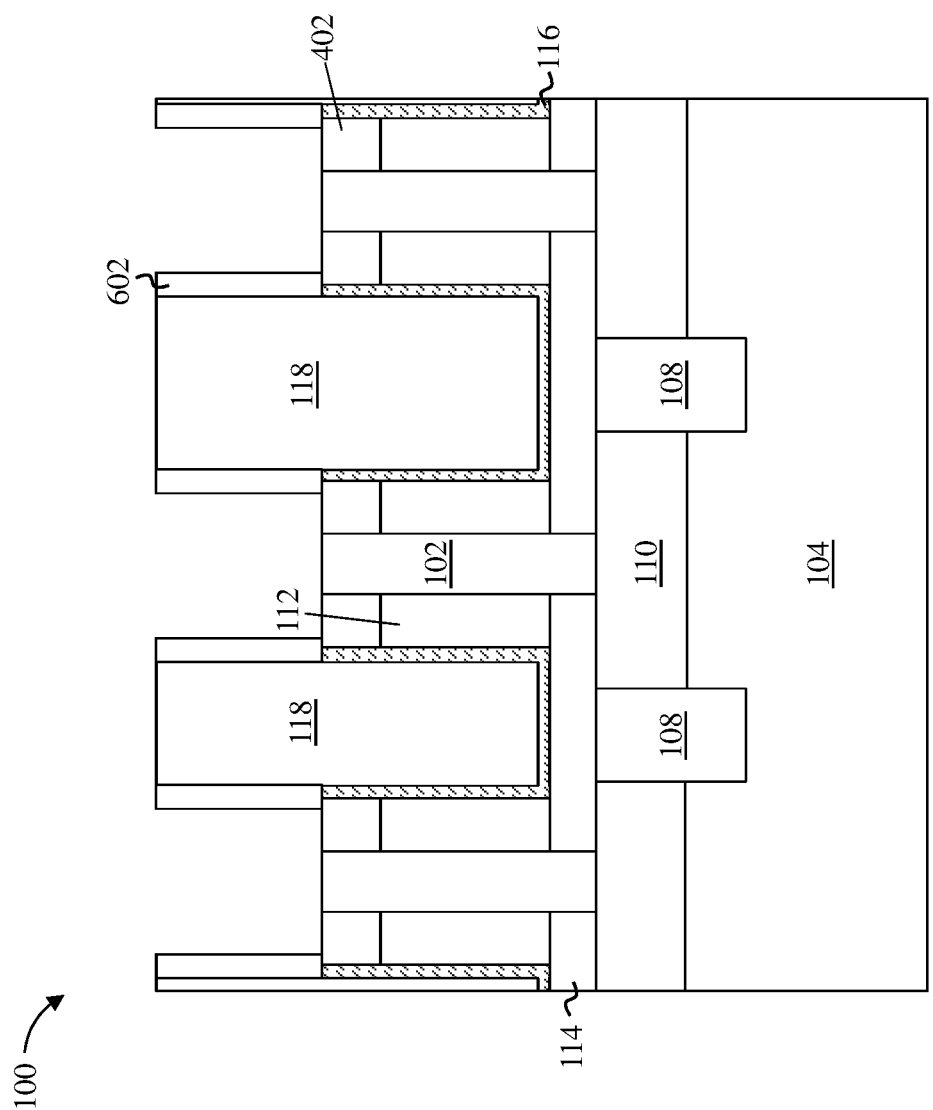
FIG. 6 depicts a cross-sectional view of a semiconductor structure after a processing operation according to one or more embodiments of the invention.

FIG. 6 depicts a cross-sectional view of the semiconductor structure 100 after a processing operation according to one or more embodiments of the invention. As illustrated in FIG. 6, sacrificial spacers 602 can be formed on sidewalls of the interlayer dielectric 118, on surfaces of the liner 116, and on surfaces of the top spacer 402. The sacrificial spacers 602 can be formed or deposited using, for example, CVD, PECVD, ALD, flowable CVD, spin-on dielectrics, PVD, or any other suitable deposition process.

In some embodiments of the invention, a material of the sacrificial spacers 602 can be selected to ensure etch selectivity with respect to later-formed top source/drain region (e.g., the top source/drain 702 depicted in FIG. 7). For example, the sacrificial spacers 602 can include germanium or a titanium oxide, which can be etched selective to a silicon source/drain. The sacrificial spacers 602 can be formed to a thickness of about 5 to 30 nm, for example 10 nm, although other thicknesses are within the contemplated scope of the invention.

Figure 7:
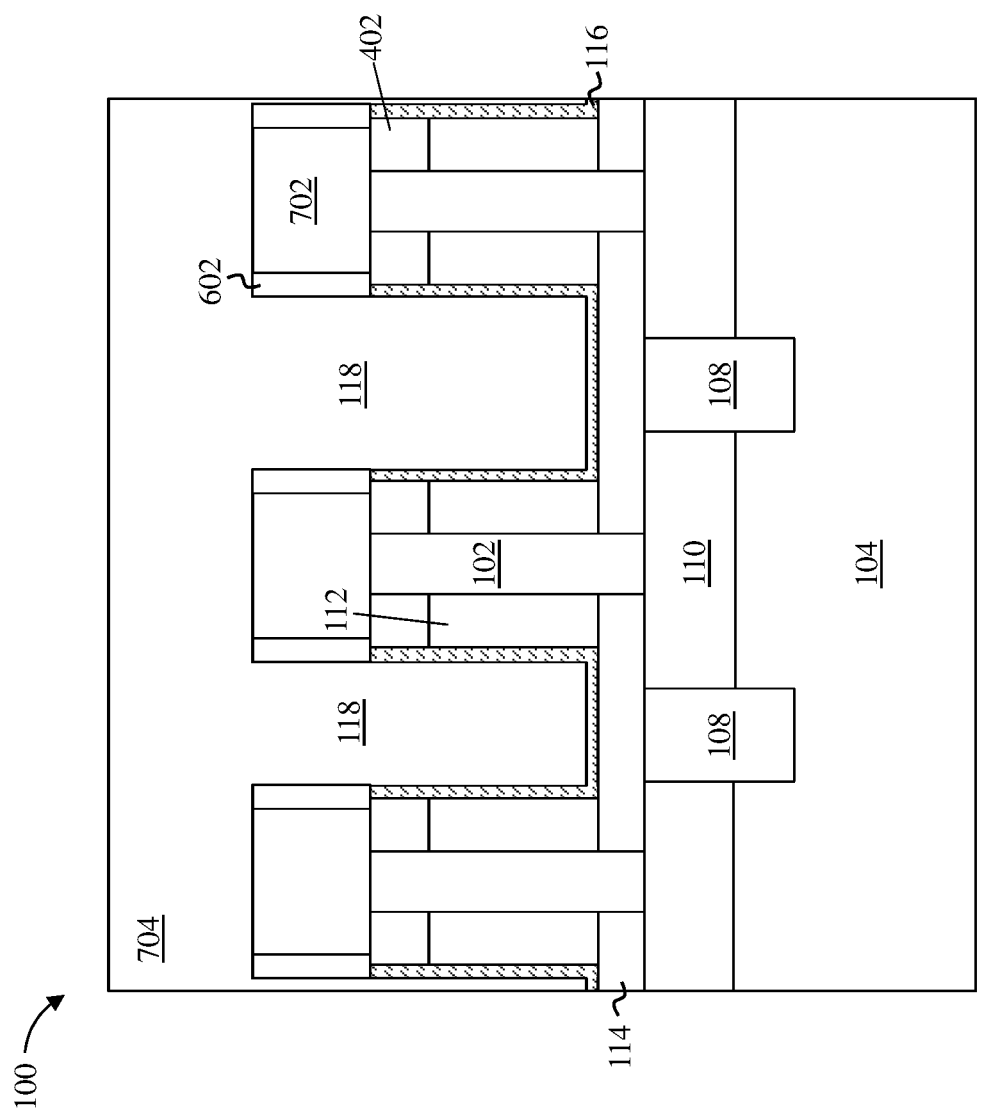
FIG. 7 depicts a cross-sectional view of a semiconductor structure after a processing operation according to one or more embodiments of the invention.

FIG. 7 depicts a cross-sectional view of the semiconductor structure 100 after a processing operation according to one or more embodiments of the invention. As illustrated in FIG. 7, top source/drain regions 702 can be formed on the semiconductor fins 102 and between sidewalls of the sacrificial spacers 602. In some embodiments of the invention, the source/drain regions 702 are epitaxially grown from exposed surfaces of the semiconductor fins 102.

In some embodiments of the invention, the source/drain regions 702 can be formed or deposited over a surface of the sacrificial spacers 602 (e.g., forming an overburden). In some embodiments of the invention, the semiconductor structure 100 is planarized to remove this overburden using, for example, CMP, such that a top surface of the source/drain regions 702 is coplanar to a top surface of the sacrificial spacers 602.

As further illustrated in FIG. 7, an interlayer dielectric 704 can be formed over the semiconductor structure 100. The interlayer dielectric 704 serves as an isolation structure for the top source/drain regions 702. The interlayer dielectric 704 can be made of any suitable dielectric material, such as, for example, porous silicates, carbon doped oxides, silicon dioxides, silicon nitrides, silicon oxynitrides, silicon carbide (SiC), or other dielectric materials. Any known manner of forming the interlayer dielectric 704 can be utilized, such as, for example, CVD, PECVD, ALD, flowable CVD, spin-on dielectrics, or PVD. In some embodiments of the invention, the interlayer dielectric 704 and the interlayer dielectric 118 are made of a same dielectric material, and together define a single continuous interlayer dielectric region (also referred to as an isolation structure).

Figure 8:
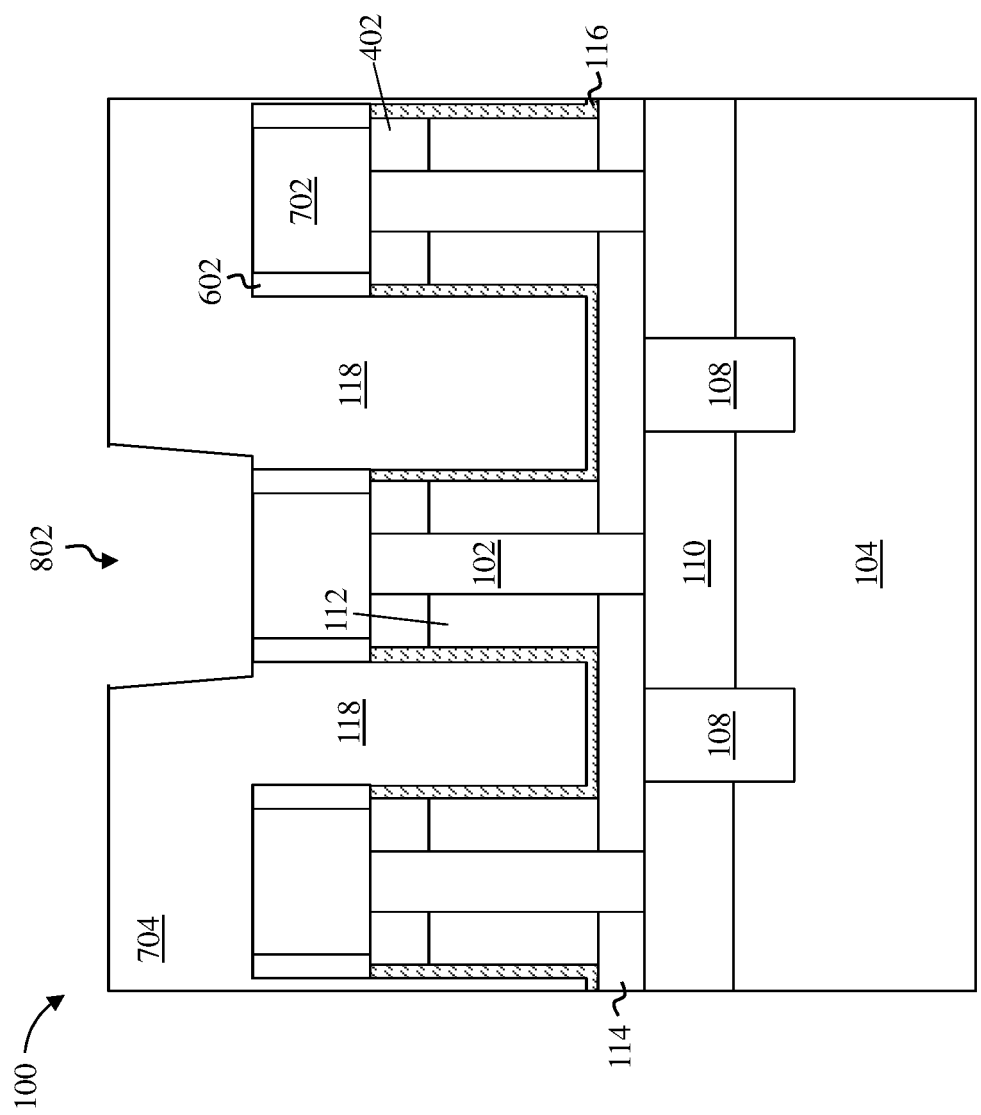
FIG. 8 depicts a cross-sectional view of a semiconductor structure after a processing operation according to one or more embodiments of the invention.

FIG. 8 depicts a cross-sectional view of the semiconductor structure 100 after a processing operation according to one or more embodiments of the invention. As illustrated in FIG. 8, a contact trench 802 can be formed in the interlayer dielectric 704. The contact trench 802 can be formed using a wet or dry etch, for example, a RIE. In some embodiments of the invention, the RIE can be selective to the sacrificial spacers 602 and/or the top source/drain regions 702 (e.g., selective to germanium or titanium oxide, depending on the material selected for the sacrificial spacers 602). In other words, the RIE can land on an exposed surface of the sacrificial spacers 602.

Figure 9:
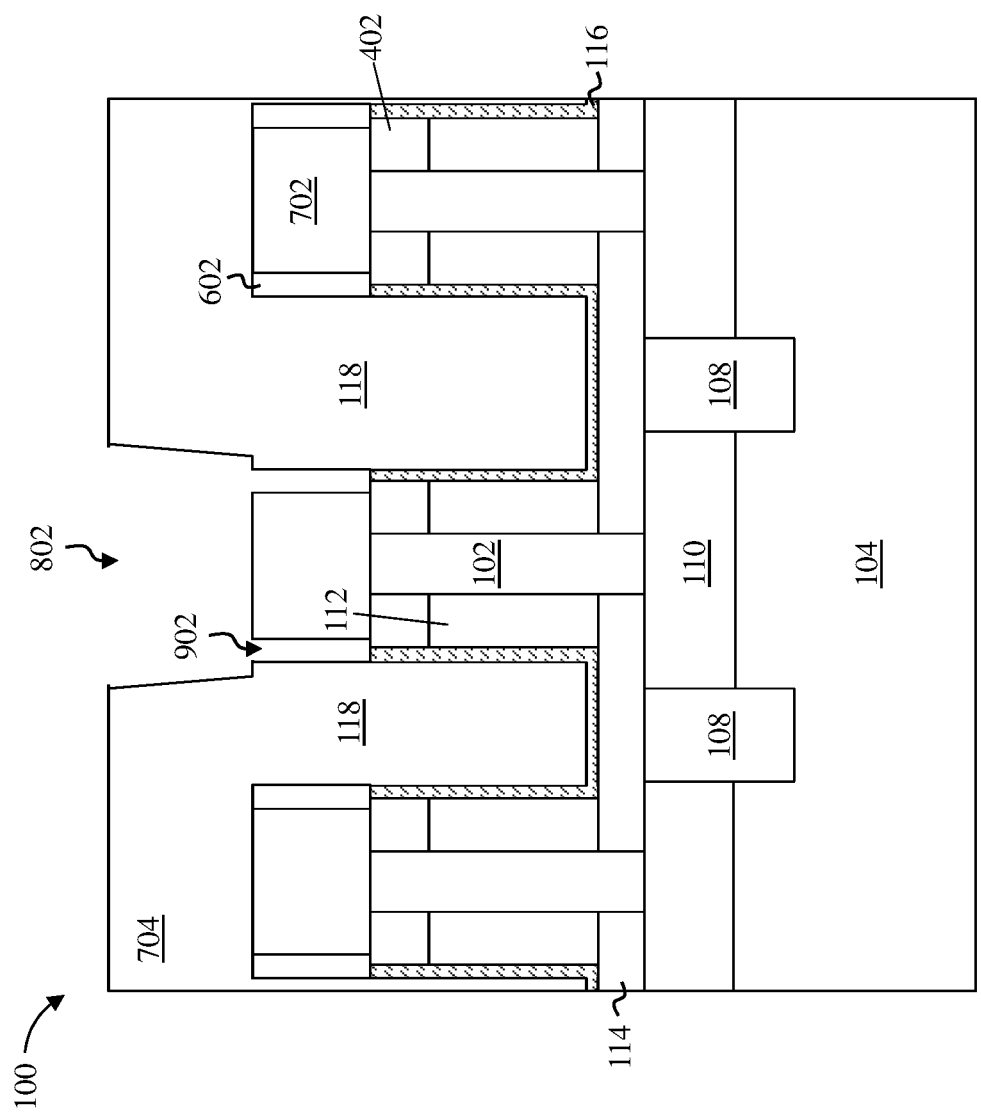
FIG. 9 depicts a cross-sectional view of a semiconductor structure after a processing operation according to one or more embodiments of the invention.

FIG. 9 depicts a cross-sectional view of the semiconductor structure 100 after a processing operation according to one or more embodiments of the invention. As illustrated in FIG. 9, the exposed sacrificial spacers 602 under the contact trench 802 can be removed to expose a surface of the liner 116 and the top spacer 402.

The sacrificial spacers 602 can be removed using, for example, a wet etch, a dry etch, or a combination of sequential wet and/or dry etches. In some embodiments of the invention, the sacrificial spacers 602 are removed selective to the liner 116 and/or the top spacer 402. For example, in embodiments where the sacrificial spacers 602 are germanium or titanium oxide, known selective etch chemistries, such as fluorine, chlorine, and bromine-based low-pressure plasmas and buffered hydrofluoric acid (BHF), can be used to remove the sacrificial spacers 602. In this manner, a WAC cavity 902 can be formed around the top source/drain regions 702.

Figure 10:
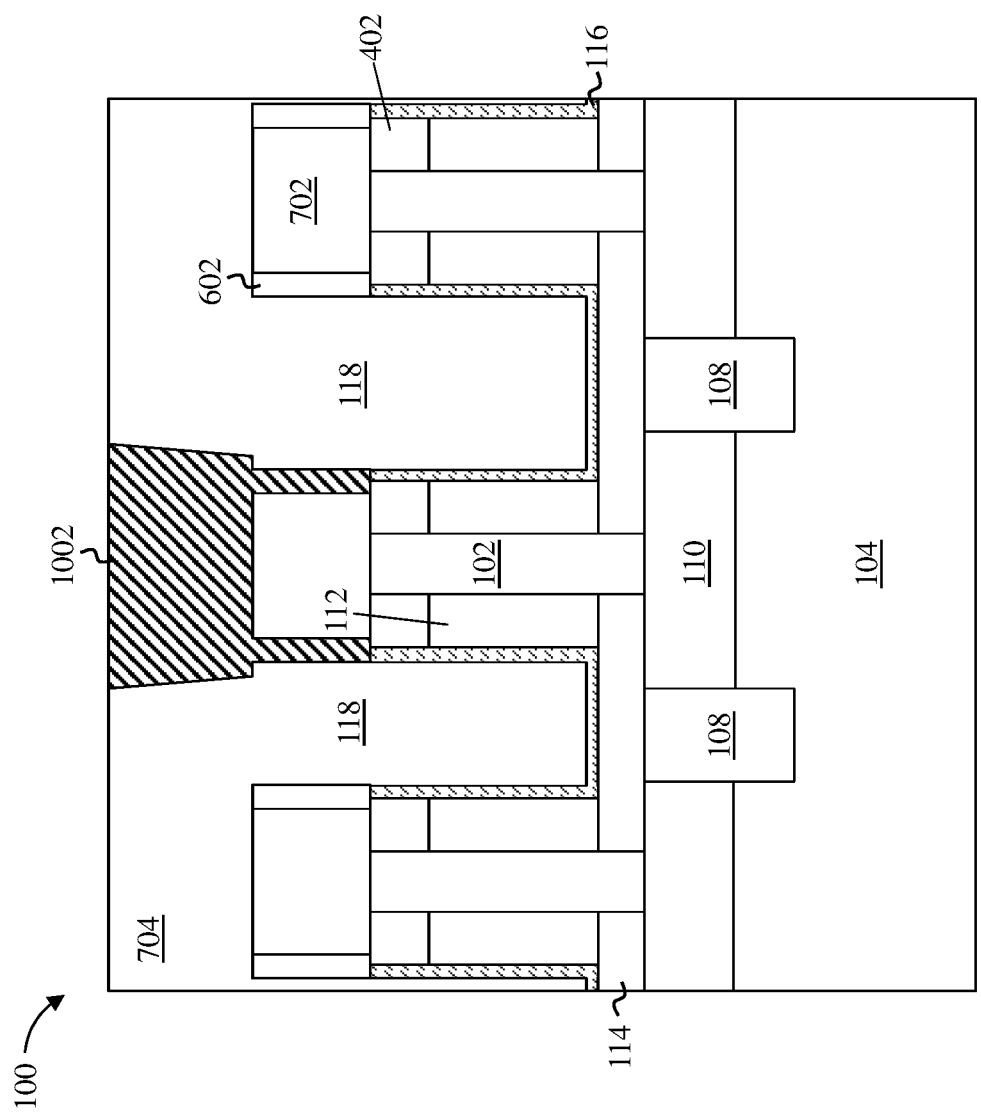
FIG. 10 depicts a cross-sectional view of a semiconductor structure after a processing operation according to one or more embodiments of the invention.

FIG. 10 depicts a cross-sectional view of the semiconductor structure 100 after a processing operation according to one or more embodiments of the invention. As illustrated in FIG. 10, a WAC 1002 can be formed by depositing or forming a conductive material within the contact trench 802 and the WAC cavity 902.

The WAC 1002 can be formed or deposited using known metallization techniques. In some embodiments of the invention, the WAC 1002 is overfilled above a surface of the interlayer dielectric 704. The WAC 1002 can be made of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the WAC 1002 is a cobalt or tungsten contact. The conductive material can further include dopants that are incorporated during or after deposition. In some embodiments of the invention, the WAC 1002 can include a barrier metal liner (not depicted). Material examples include tantalum nitride and tantalum (TaN/Ta), titanium, titanium nitride, cobalt, ruthenium, and manganese.

Figure 11:
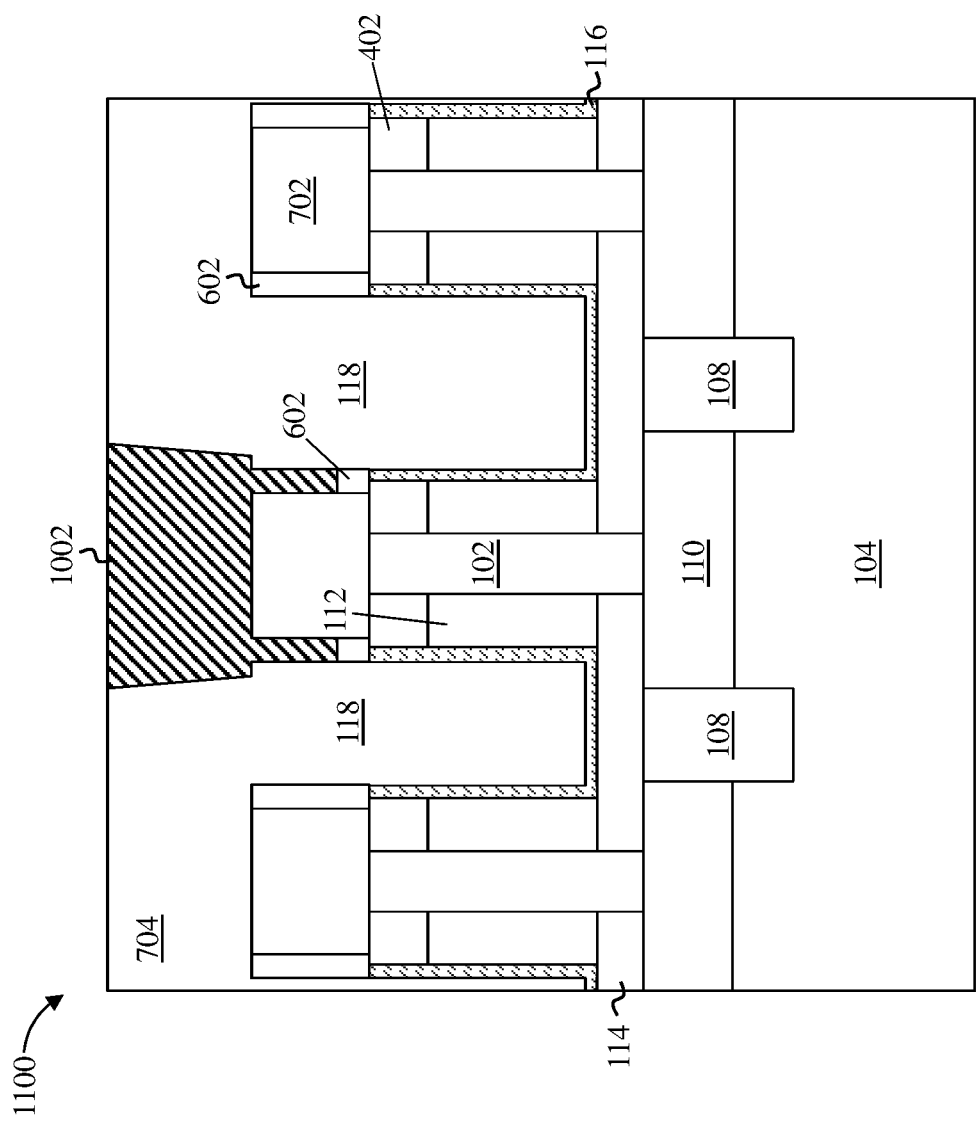
FIG. 11 depicts a cross-sectional view of a semiconductor structure after a processing operation according to one or more embodiments of the invention.

FIG. 11 depicts a cross-sectional view of a semiconductor structure 1100 after a processing operation according to one or more embodiments of the invention. FIG. 11 illustrates an alternative embodiment whereby the sacrificial spacers 602 formed over the top spacer 402 (as depicted in FIG. 6) are not completely removed when forming the WAC cavity 902 (as depicted in FIG. 9). Instead, the sacrificial spacers 602 are recessed within the WAC cavity 902. In this manner, a portion of the sacrificial spacers 602 remain in the WAC cavity 902.

Figure 12:
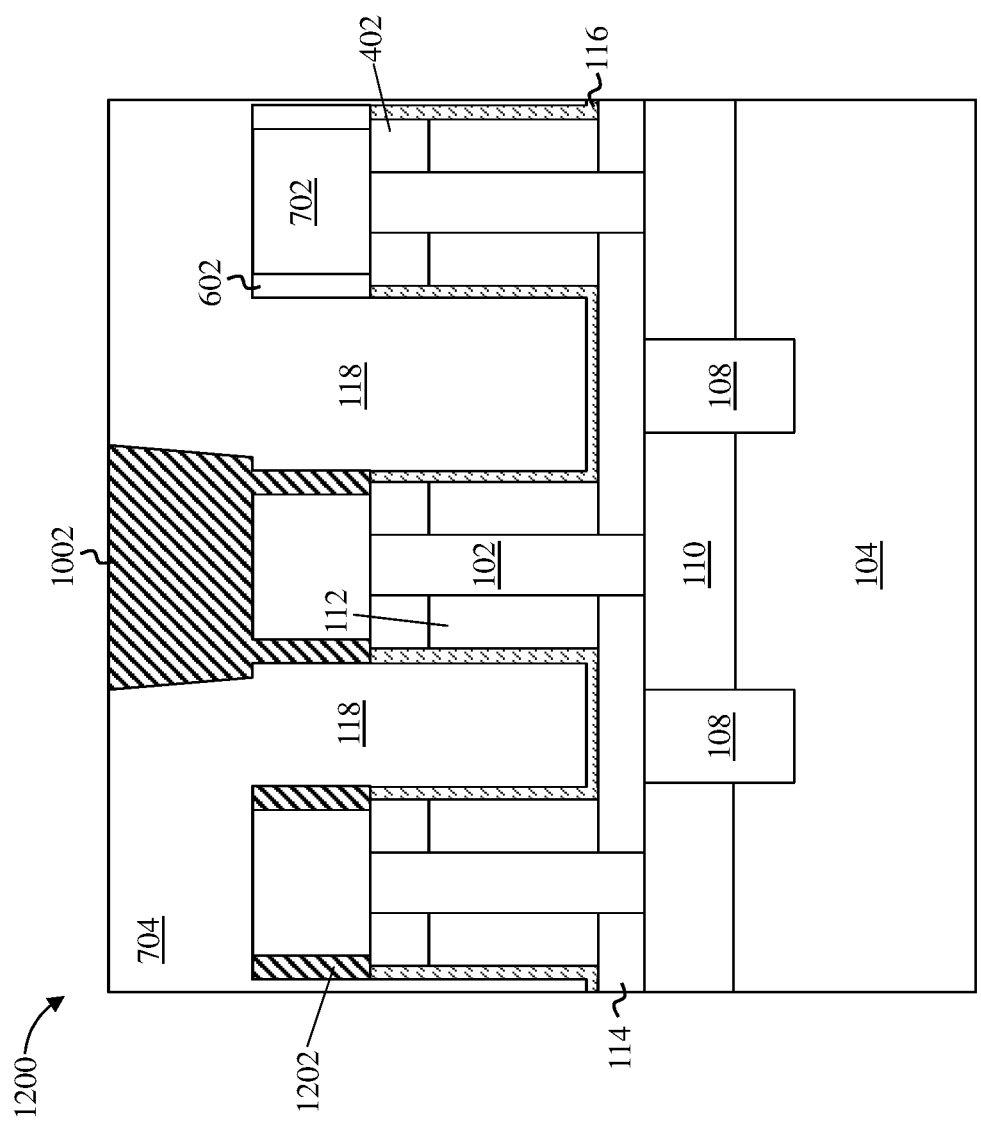
FIG. 12 depicts a cross-sectional view of a semiconductor structure after a processing operation according to one or more embodiments of the invention.

FIG. 12 depicts a cross-sectional view of a semiconductor structure 1200 after a processing operation according to one or more embodiments of the invention. FIG. 12 illustrates an alternative embodiment whereby the etch process for removing the sacrificial spacers 602 that are under the contact trench 802 (as depicted in FIG. 9) also removes a portion (or entirety) of an adjacent sacrificial spacer (not shown). For example, an extended isotropic etch can result in removing sacrificial material from the sacrificial spacers 602 under the contact trench 802 as well as from any adjacent spacers. In some embodiments of the invention, the adjacent sacrificial spacer(s) are wholly or partially replaced with conductive material 1202 during the WAC 1002 deposition process.

Figure 13:
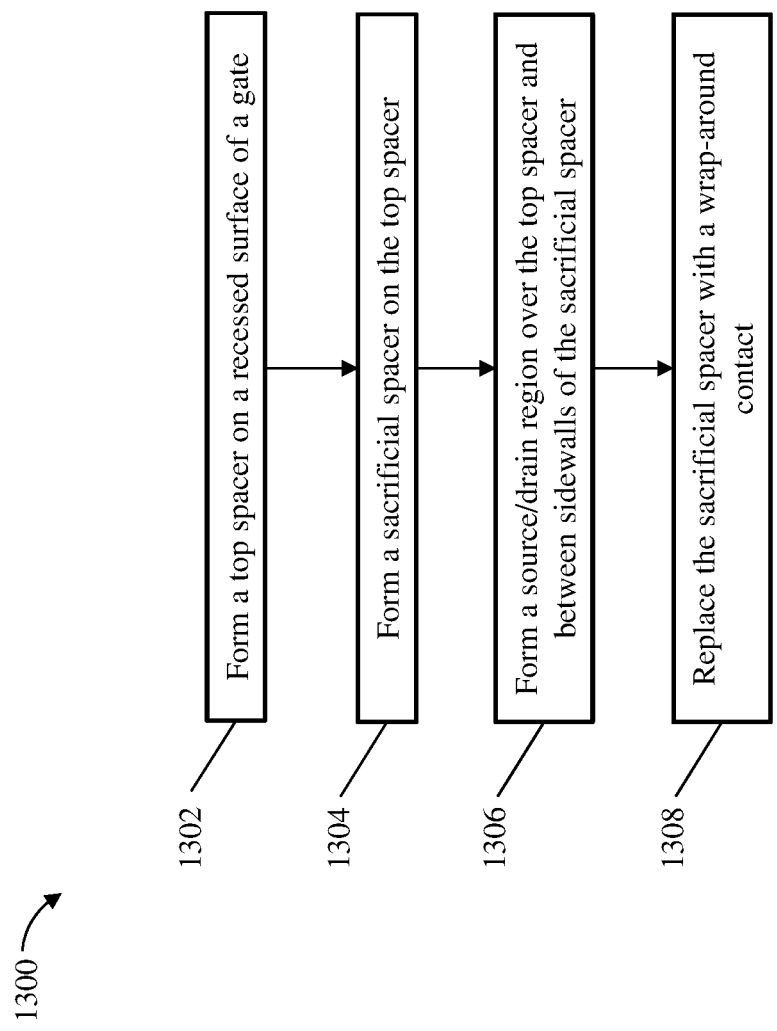
FIG. 13 depicts a flow diagram illustrating a method according to one or more embodiments of the invention.

FIG. 13 depicts a flow diagram 1300 illustrating a method for forming a semiconductor device according to one or more embodiments of the invention. As shown at block 1302, a top spacer is formed on a recessed surface of a gate. The top spacer and recessed gate can be formed in a similar manner as the top spacer 402 and the gates 112 as depicted in FIG. 4 and FIG. 3, respectively.

At block 1304, a sacrificial spacer is formed on the top spacer. The sacrificial spacer can be formed in a similar manner as the sacrificial spacers 602 depicted in FIG. 6. At block 1306, a source/drain region is formed over the top spacer and between sidewalls of the sacrificial spacer. The source/drain region can be formed in a similar manner as the top source/drain 702 depicted in FIG. 7.

At block 1308, the sacrificial spacer is replaced with a wrap-around contact. In some embodiments of the invention, the source/drain region includes a first material, the sacrificial spacer includes a second material, and the second material is selected such that the second material can be etched selective to the first material. In some embodiments of the invention, the second material includes germanium or titanium oxide.

The method can further include forming a semiconductor fin over a substrate. In some embodiments of the invention, the semiconductor fin is a vertical fin of a vertical field effect transistor. A gate can be formed over a channel region of the semiconductor fin and the gate can be recessed to expose a sidewall of the semiconductor fin.

The method can further include forming a liner on a sidewall of the gate and forming an interlayer dielectric on the liner. The liner and interlayer dielectric can be formed in a similar manner as the liner 116 and the interlayer dielectric 118, as depicted in FIG. 1. In some embodiments of the invention, a portion of the liner is removed prior to forming the sacrificial spacer (e.g., as depicted in FIG. 5).

Figure 14:
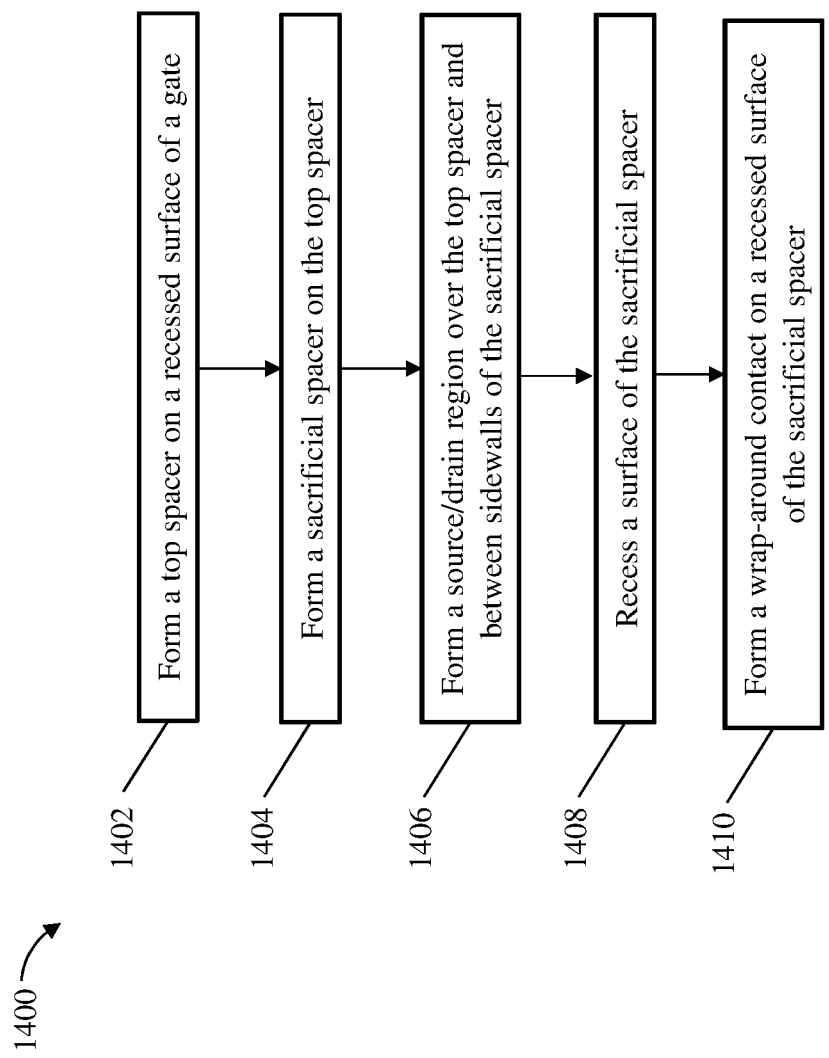
FIG. 14 depicts a flow diagram illustrating a method according to one or more embodiments of the invention.

FIG. 14 depicts a flow diagram 1400 illustrating a method for forming a semiconductor device according to one or more embodiments of the invention. As shown at block 1402, a top spacer is formed on a recessed surface of a gate. At block 1404, a sacrificial spacer is formed on the top spacer. At block 1406, a source/drain region is formed over the top spacer and between sidewalls of the sacrificial spacer. The top spacer, gate, sacrificial spacer, and source/drain region can each be formed in a similar manner as the top spacer 402, the gates 112, the sacrificial spacers 602, and the top source/drain 702, respective, as described previously herein.

At block 1408, a surface of the sacrificial spacer is recessed. The sacrificial spacer can be recessed in a similar manner as described previously herein with respect to FIG. 11. At block 1410, a wrap-around contact is formed on a recessed surface of the sacrificial spacer.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
   forming a top spacer on a surface of a gate;
   forming a sacrificial spacer on the top spacer;
   forming a source or drain (S/D) region over the top spacer and between sidewalls of the sacrificial spacer; and
   replacing the sacrificial spacer with a wrap-around contact.

2. The method of claim 1 further comprising forming a semiconductor fin over a substrate.

3. The method of claim 2, wherein the semiconductor fin comprises a vertical fin of a vertical field effect transistor.

4. The method of claim 2 further comprising forming the gate over a channel region of the semiconductor fin.

5. The method of claim 4 further comprising recessing the gate to expose a sidewall of the semiconductor fin.

6. The method of claim 1, wherein the source/drain region comprises a first material, the sacrificial spacer comprises a second material, and the second material can be etched selective to the first material.

7. The method of claim 6, wherein the second material comprises germanium or titanium oxide.

8. The method of claim 5 further comprising forming a liner on a sidewall of the gate.

9. The method of claim 8 further comprising forming an interlayer dielectric on the liner.

10. The method of claim 9 further comprising removing a portion of the liner prior to forming the sacrificial spacer.

11. A method for forming a semiconductor device, the method comprising:
   forming a top spacer on a surface of a gate;
   forming a sacrificial spacer on the top spacer;
   forming a source/drain region over the top spacer and between sidewalls of the sacrificial spacer;
   recessing a surface of the sacrificial spacer; and
   forming a wrap-around contact on a recessed surface of the sacrificial spacer.

12. The method of claim 11 further comprising forming a semiconductor fin over a substrate.

13. The method of claim 12, wherein the semiconductor fin comprises a vertical fin of a vertical field effect transistor.

14. The method of claim 12 further comprising:
   forming the gate over a channel region of the semiconductor fin; and
   recessing the gate to expose a sidewall of the semiconductor fin.

15. The method of claim 11, wherein the source/drain region comprises a first material, the sacrificial spacer comprises a second material, and the second material can be etched selective to the first material.

16. A semiconductor device comprising:
   a semiconductor fin on a bottom source/drain region of a substrate;
   a gate over a channel region of the semiconductor fin;
   a top source/drain region on a surface of the semiconductor fin;
   a top spacer between a surface of the top source/drain region and the gate;
   a wrap-around contact positioned on sidewalls and a top surface of the top source/drain region; and
   a sacrificial spacer formed between a bottom surface of the wrap-around contact and the top spacer.

17. The semiconductor device of claim 16, wherein the semiconductor fin comprises a vertical fin of a vertical field effect transistor.

18. The semiconductor device of claim 17 further comprising:
   a liner on a sidewall of the gate;
   wherein a portion of the wrap-around contact is on a surface of the liner.

19. The semiconductor device of claim 18, wherein the wrap-around contact is on a surface of top spacer.

* * * * *